US008334454B2

(12) United States Patent  (10) Patent No.: US 8,334,454 B2
Yao et al.  (45) Date of Patent: Dec. 18, 2012

(54) THIN FILM PHOTOVOLTAIC DEVICE

(75) Inventors: Kui Yao, Singapore (SG); Santiranjan Shannigrahi, Singapore (SG); Mei M. Chen, Singapore (SG); Bee K. Gan, Singapore (SG)

(73) Assignee: Agency for Science, Technology and Research (SG)

( * ) Notice: Subject to any disclaimer, the term of this patent is extended or adjusted under 35 U.S.C. 154(b) by 206 days.

(21) Appl. No.: 12/928,092

(22) Filed: Dec. 3, 2010

(65) Prior Publication Data

US 2011/0081733 A1    Apr. 7, 2011

Related U.S. Application Data

(62) Division of application No. 11/386,295, filed on Mar. 21, 2006, now Pat. No. 7,851,697.

(60) Provisional application No. 60/664,652, filed on Mar. 22, 2005.

(51) Int. Cl.
  *H01L 31/0224* (2006.01)
  *H01L 31/042* (2006.01)

(52) U.S. Cl. .......... 136/256; 136/252; 136/255; 438/22; 438/57

(58) Field of Classification Search .......... 136/252, 136/255, 256; 438/22, 57
  See application file for complete search history.

(56) References Cited

U.S. PATENT DOCUMENTS

| 4,365,106 | A | * | 12/1982 | Pulvari | 136/206 |
|---|---|---|---|---|---|
| 5,364,710 | A | | 11/1994 | Hikita | |
| 6,781,176 | B2 | | 8/2004 | Ramesh | |
| 7,405,793 | B2 | | 7/2008 | Rosselli et al. | |
| 2003/0031400 | A1 | * | 2/2003 | Pruneri | 385/14 |
| 2003/0037815 | A1 | * | 2/2003 | Kim et al. | 136/256 |
| 2003/0121542 | A1 | * | 7/2003 | Harneit et al. | 136/244 |
| 2006/0042680 | A1 | * | 3/2006 | Korman et al. | 136/251 |
| 2006/0260669 | A1 | * | 11/2006 | Rosselli et al. | 136/244 |
| 2007/0125981 | A1 | | 6/2007 | Roberts et al. | |

FOREIGN PATENT DOCUMENTS

EP    1 367 653    12/2003

OTHER PUBLICATIONS

A.L. Kholkin et al., "Photoelectric Evaluation of Polarization and Internal Field in PZT Thin-Films," *Integrated Ferroelectrics*, vol. 35, No. 1-4 (2001), pp. 261-268.

(Continued)

*Primary Examiner* — Fernando L Toledo
*Assistant Examiner* — Peter Bradford
(74) *Attorney, Agent, or Firm* — Martine Penilla Group, LLP (57) ABSTRACT

The present invention provides a thin film photovoltaic device and a method of forming a thin film photovoltaic device. The thin film photovoltaic device has a substrate, a thin film layer formed on the substrate and first and second electrodes formed on one side of the thin film layer. By applying an electric field over the first and second electrodes, the thin film layer is polarized in a direction parallel to the surface plane of the film. Upon exposure to light, the thin film layer converts light energy into electricity. According to the method, a thin film layer is formed on a substrate. A first electrode and a second electrode are formed on one side of the thin film layer. By applying an electric field over the first and second electrodes, the thin film layer is polarized in a direction parallel to the surface plane of the film.

10 Claims, 10 Drawing Sheets

OTHER PUBLICATIONS

P. Poosanaas-Burke, I.R. Abothu, and K. Uchino, "Fabrication and Device Design of Bulk and Thin Films Photostrictive Materials," *Proc. IEEE Instrumentation and Measurement Technology Conference*, Budapest, Hungary, May 21-23, (2001) vol. 1, pp. 443-447.

Ichiki et al., "Photovoltaic Effect of Lead Lanthanum Zirconate Titanate in a Layered Film Structure Design," *Appl. Phys. Lett.*, vol. 84, No. 3, (Jan. 2004), pp. 395-397.

K Yao, B.K. Gan, M. Chen, and S. Shannigrahi, "Large Photo-Induced Voltage in a Ferroelectric Thin Film with In-Plane Polarization," *Appl. Phys. Lett.*, vol. 87, No. 21, (2005), pp. 212906-1 to 212906-3.

Swart et al., "Pi-Pi Stacking Tackled with Density Functional Theory," *Journal of Molecular Modeling*, vol. 13 (2007) pp. 1245-1257.

Grelet el al., "Control of the Orientation of Thin Open Supported Columnar Liquid Crystal Films by the Knetics of Growth," *Europhysics Letters*, vol. 73, No. 5 (2006) pp. 712-720.

\* cited by examiner

THIN FILM PHOTOVOLTAIC DEVICE

CROSS REFERENCE TO RELATED APPLICATION

This application is a divisional of U.S. patent application Ser. No. 11/386,295, filed on Mar. 21, 2006 now U.S. Pat. No. 7,851,697, which claims priority from U.S. Provisional Application No. 60/664,652, filed on Mar. 22, 2005, both of which are incorporated herein by reference for all purposes.

FIELD OF THE INVENTION

The present invention relates to a photovoltaic device and in particular, to a thin film photovoltaic device made of ferroelectric material.

BACKGROUND OF THE INVENTION

Photovoltaic devices are used in several industrial applications to produce electricity under illumination of light. A conventional photovoltaic device has a semiconductor p-n junction and a pair of electrodes. Upon exposure to light, the semiconductor p-n junction converts the optical energy into electrical energy output via the electrodes.

Photovoltaic devices of the above kind, however, may only produce a photovoltaic voltage below a couple of volts, due to the fundamental limitation of the semiconductor photovoltaic effect. To obtain a higher photovoltage, ferroelectric materials with aligned spontaneous electric polarization have been the subject of research since the 1970's. Examples of ferroelectric photovoltaic materials are the bulk ferroelectric ceramic and single crystal materials. This type of devices is capable of producing a voltage of several hundred volts.

Figure 1:
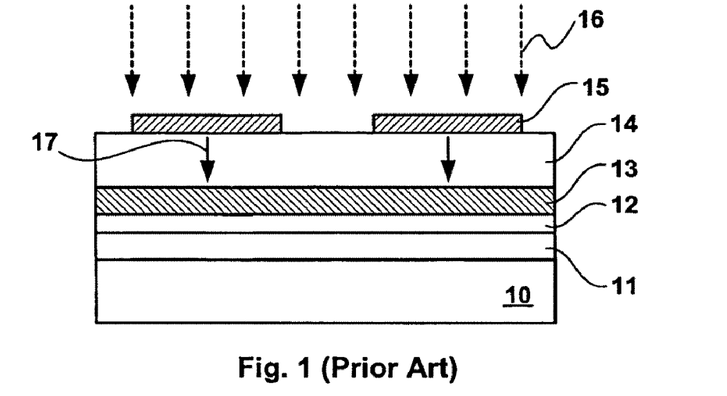
FIG. 1 is a cross-sectional view of a conventional photovoltaic device based on a ferroelectric thin film.

Because bulk ferroelectric ceramic and single crystal materials are difficult to be integrated into micro systems, such as micro electromechanical systems (MEMS), researchers have expanded their efforts to focus on ferroelectric thin films since the 1990's. FIG. 1 shows a conventional ferroelectric thin film photovoltaic device. The device is comprised of a substrate 10, a bottom electrode 13 formed on substrate 10 via intermediate layers 11 and 12, a ferroelectric layer 14 formed on bottom electrode 13 and one or more top electrodes 15 formed on ferroelectric layer 14. An electric field is applied to ferroelectric layer 14 through top and bottom electrodes 15 and 13, to pole the ferroelectric layer 14. The ferroelectric polarization 17 is therefore aligned perpendicular to the ferroelectric layer 14. When exposed to light 16, the photovoltage device generates a photovoltage between top and bottom electrodes.

The photovoltage generated by this type of device is very low, typically only below one volt. To increase photovoltage, the thickness of the ferroelectric layer 14 may be increased. The consequence of increasing the thickness of the ferroelectric layer is that, the fabrication of the device becomes more complicated and at higher cost. The overall volume of the photovoltaic device also increases, which are not desirable characteristics in micro systems or micro devices, such as MEMS.

As such, ferroelectric thin film photovoltaic devices, much like the semiconductor photovoltaic device, are limited to producing a photovoltage of below one volt. In many applications, particularly involving mechanical movement, such as MEMS, this low-level of voltage may be insufficient. Researchers, therefore, seek to provide a ferroelectric thin film photovoltaic device capable of providing higher photovoltages, without increasing the thickness of the ferroelectric layer, which are suitable for applications such as MEMS or the like.

SUMMARY OF INVENTION

Embodiments of the present invention provide a thin film photovoltaic device and a method of forming a thin film photovoltaic device. According to one aspect, a thin film photovoltaic device is provided. The thin film photovoltaic device includes a substrate having a main surface plane, a thin film layer formed on the main surface plane of the substrate, and first and second electrodes formed on one side of the thin film layer. The thin film layer serves the purpose of converting light into electricity to generate photovoltaic outputs. By applying an electric field over the first and second electrodes, the thin film layer is polarized in a direction about parallel to the main plane of the substrate, ie, parallel with the surface plane of the thin film layer. An electric polarization is therefore formed in the thin film layer between the first and second electrodes. Upon exposure to light, the thin film layer converts light energy into electricity to generate photovoltaic outputs. The first and second electrodes therefore collect the photovoltaic outputs.

The term "thin film" or "thin film layer" is referred to in the context to define the characteristics of the light-electricity conversion component of the photovoltaic device, to distinguish from the bulk material such as bulk ferroelectric ceramic used in conventional devices. According to embodiments of the present invention, the thickness of the thin film layer is below about 10 micrometers. Most typically, the thickness of the thin film layer is below about 5 micrometers.

According to another aspect, the present invention provides a thin film photovoltaic device having a substrate, a thin film layer formed on the substrate, and first and second electrodes formed in contact with the thin film layer. The thin film layer is polarized in a direction parallel to a main plane of the substrate. Upon exposure to light, the thin film layer converts light energy into an photovoltaic output.

According to a further aspect, the present invention provides a method of forming a thin film photovoltaic device. According to the method, a thin film layer is formed on a substrate. Thereafter, a first electrode and a second electrode are formed on one side of the thin film layer. By applying an electric field over the first and second electrodes, the thin film layer is polarized in a direction about parallel to the main plane of the substrate.

With these and other advantages and features of the invention that will become hereinafter apparent, the nature of the invention may be more clearly understood by reference to the following detailed description of the invention, the appended claims and to the drawings attached herein.

BRIEF DESCRIPTION OF THE DRAWINGS

These and other aspects and advantages of the present invention will be described in detail with reference to the accompanying drawings, in which.

DETAILED DESCRIPTION OF THE PREFERRED EMBODIMENTS

Figure 2A:
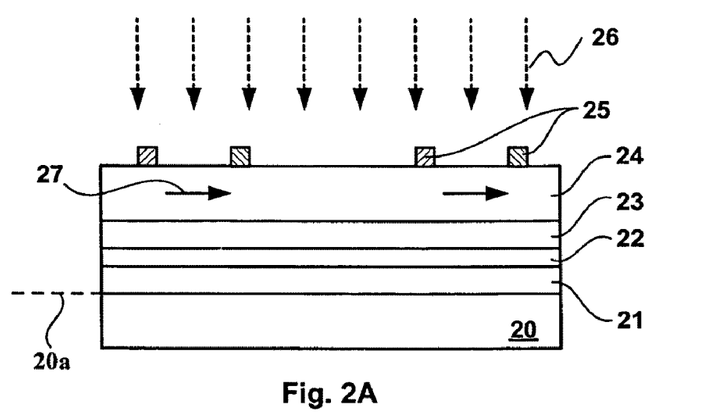
FIG. 2A is a cross-sectional view of a photovoltaic device according to one embodiment of the present invention.
Figure 2B:
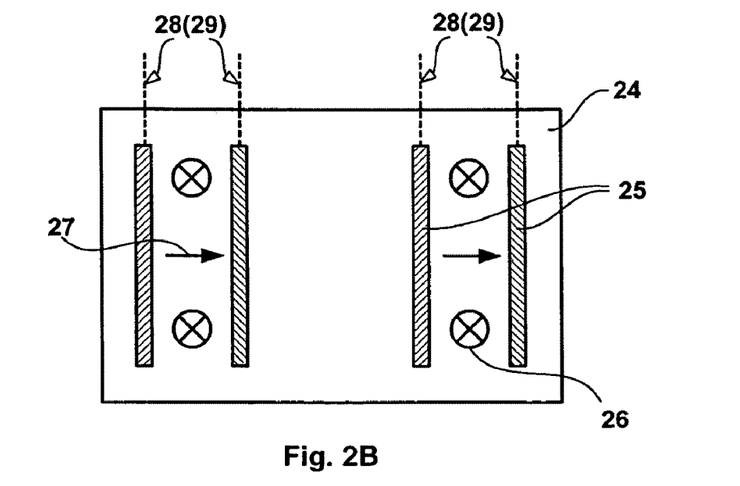
FIG. 2B is a top view of FIG. 2A.

As shown in FIGS. 2A and 2B, a thin film photovoltaic device according to one embodiment of the present invention has a thin film layer, for example a ferroelectric thin film layer 24 formed on a substrate 20. Intermediate layers 21, 22 and 23 may be formed on substrate 20 prior to the formation of ferroelectric thin film layer 24. Intermediate layers 21, 22 and 23 are not all electrically conductive. One or more pairs of electrodes 25 are situated on the top surface of ferroelectric thin film layer 24. One of each pair of electrodes 25 is situated apart from another on the top surface of the ferroelectric thin film layer 24. An electric field 28 is applied between each pair of electrodes 25, to polarize the ferroelectric thin film layer 24. The ferroelectric polarization 27 is therefore aligned in the direction parallel to a main surface plane 20a of substrate 20, and hence parallel to the ferroelectric layer 24. According to this embodiment, when a beam of ultraviolet (UV) light 26 illuminates the top surface of ferroelectric layer 24, a photovoltaic signal 29 is generated between each pair of electrodes 25.

The electrodes may be separated by a distance greater than the thickness of the ferroelectric layer. A thin film photovoltaic device according to embodiment of the present invention therefore overcomes the limitation that restricts the photovoltage increase due to the thickness-dependent nature of the conventional ferroelectric thin film photovoltaic devices. A thin film photovoltaic device according to embodiments of the present invention allows for generation of higher photovoltage without increasing the thickness of the ferroelectric layer.

Furthermore, as both electrodes are situated on one side of the ferroelectric thin film layer 24, when external electric field is applied to the electrodes, the ferroelectric thin film layer is polarized in a direction parallel to the main surface plane 20a of substrate 20, and hence parallel to the surface of the ferroelectric thin film layer. This avoids the requirement of forming a top electrode covering the ferroelectric thin film layer, as required in the conventional photovoltaic devices. In the present embodiment, the ferroelectric thin film layer of the photovoltaic device is exposed directly to light, allowing for more efficient optical energy absorption. Direct exposure of the ferroelectric layer to light also enhances photovoltage generation.

The present embodiment is further advantageous in that, the electrodes are formed after the formation of the ferroelectric thin film on the substrate. This provides a greater flexibility on the material selection for making the electrodes. For example, the electrodes need not be made from a noble metal material (typically Pt), as that required in conventional devices in order to sustain the high temperature in oxidizing ambient required for processing the ferroelectric thin film. Instead, the electrodes according to embodiments of the present invention may be selected from low cost electrical-conductive materials, as long as these materials are electrically conductive.

Another advantage of this embodiment is that, it allows electrodes to be formed on the same side of the ferroelectric layer. This provides the freedom to fabricate the electrodes in varieties of circuit patterns and configurations, which may further increase the photovoltage generated. For example, electrodes may be formed for connection in parallel and/or series, in a way which is much more convenient than in conventional devices. This is discussed in further detail below.

Figure 3A:
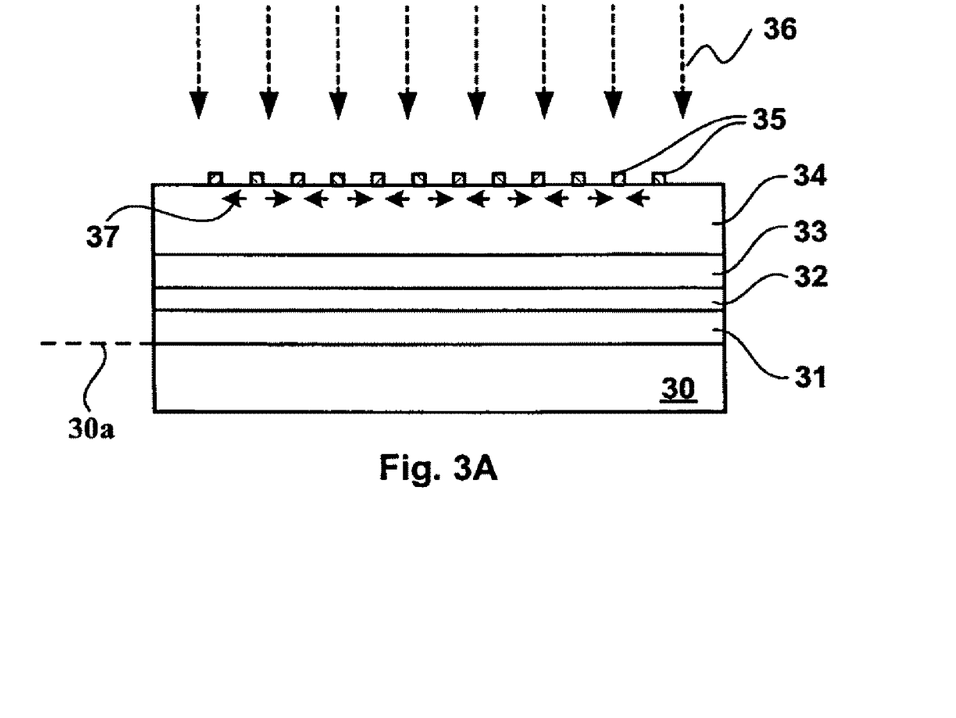
FIG. 3A is a cross-sectional view of a photovoltaic device according to another embodiment of the present invention.
Figure 3B:
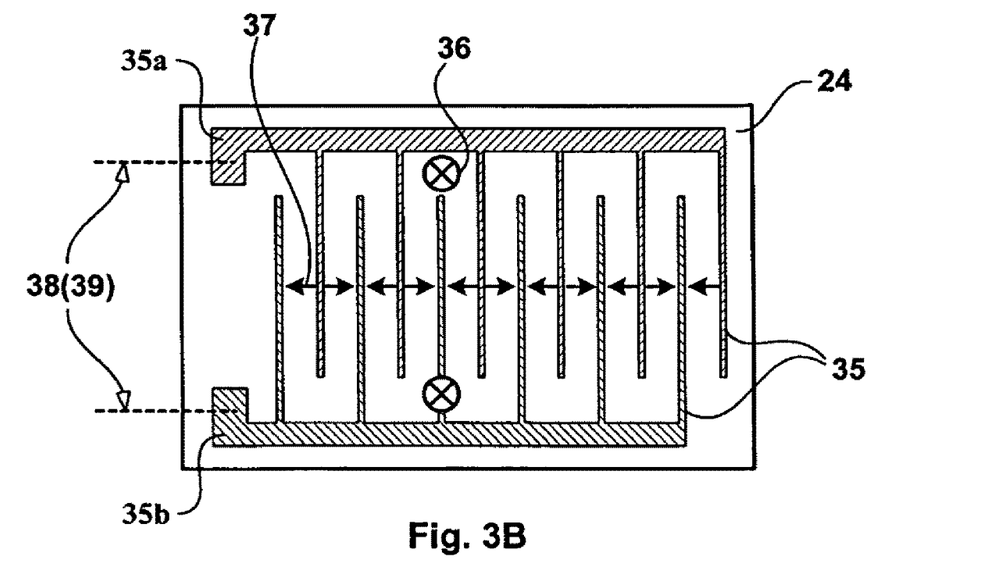
FIG. 3B is a top view of FIG. 3A.

FIGS. 3A and 3B show a thin film photovoltaic device according to another embodiment of the present invention. In this embodiment, a ferroelectric thin film layer 34 is coated on a substrate 30 via intermediate layers 31, 32 and 33. A pair of electrodes 35 is formed on the top surface of ferroelectric thin film layer 34. The pair of electrodes 35 is comb-shaped, each having a plurality of fingers. Each finger of one electrode is positioned in a space between adjacent fingers of the other electrode. Electrodes with fingers disposed in this manner are referred to thereafter as interdigitally disposed, or interdigital electrodes.

An electric field 38 is applied between the pair of electrodes 35, to polarize the ferroelectric thin film layer 34. Ferroelectric polarization 37 is therefore generated and aligned in the ferroelectric layer 34 between adjacent fingers of the pair of electrodes, which are aligned in a direction parallel to the main surface plane 30a of substrate 30, and hence parallel to the ferroelectric thin film layer 34. Each adjacent pair of fingers forms a photovoltaic unit. When a beam of light, such as an UV light 36 illuminates the top surface of ferroelectric layer 34, each photovoltaic unit generates a photovoltaic signal. As the pair of electrodes 35 is interdigitally disposed, the photovoltaic units are connected in parallel, hence the total photocurrent output from electrode pads 35a and 35b is the collective current of that generated by each photovoltaic unit.

A thin film photovoltaic device formed according to the present embodiment shares the advantages of the configuration shown in FIG. 2 and further, it has the ability to generate a large electric current.

Figure 4A:
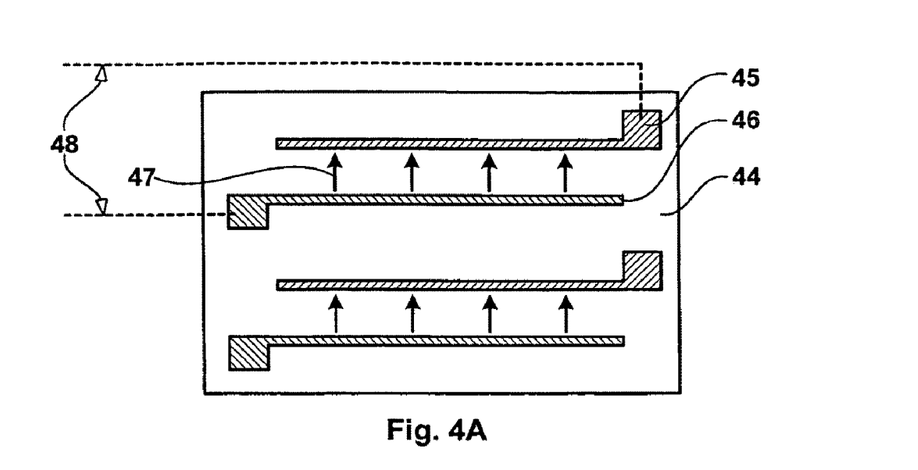
FIGS. 4A, 4B and 4C are top views of a photovoltaic device according to a further embodiment of the present invention.
Figure 4B:
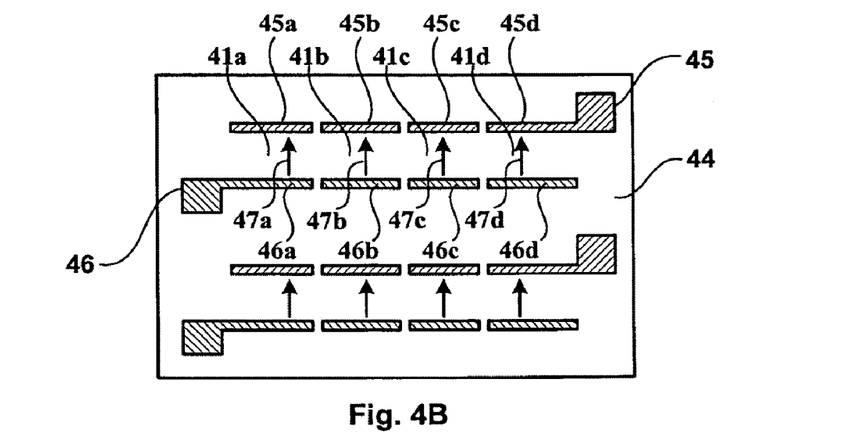
Figure 4C:
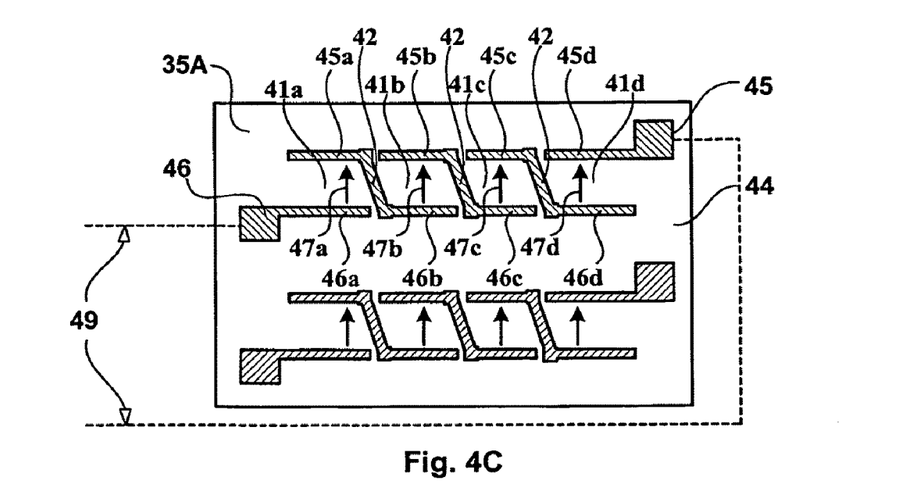

FIGS. 4A, 4B and 4C show another embodiment of a thin film photovoltaic device and its fabrication method. In the present embodiment, a ferroelectric thin film layer 44 is formed on a substrate (not shown). Two pairs of electrodes of generally elongate shaped, are deposited parallel to each other, on ferroelectric thin film 44. The first pair of electrodes 45 and 46 is now taken as an example for further illustration. An electric field 48 is applied between the pair of electrodes 45 and 46, to polarize the ferroelectric thin film layer 44. Ferroelectric polarization 47 is formed in the ferroelectric thin film layer 44 accordingly, between the pair of electrodes 45 and 46, which are aligned along a direction parallel to the main plane of the substrate, and hence parallel to the ferroelectric thin film layer 44.

After the ferroelectric thin film layer 44 is polarized, electrodes 45 and 46 are divided into two or more segments. For the purpose of illustration only, FIG. 4B shows that the each of the electrodes 45 and 46 is divided into four segments 45a, 45b, 45c, 45d and 46a, 46b, 46c, 46d, respectively. Each pair of segments 45a and 46a, 45b and 46b, 45c and 46c, 45d and 46d forms individual photovoltaic units 41a, 41b, 41c and 41d, having the individual ferroelectric polarization 47a, 47b, 47c and 47d aligned along the same direction, as shown in FIG. 4B.

New electrical circuit 42 are then formed to connect the tail of one segment of the first electrode 45, for example segment 45a, to the head of the adjacent segment of the second electrode 46, for example segment 46b. Segments 45b to 46c, 45c to 46d are connected by new electrical circuit 42 in a similar manner. Accordingly, individual polarizations 47a, 47b, 47c and 47d are connected in series, as shown in FIG. 4C.

Upon exposure to UV light (not shown), a photovoltaic device configured according to the present embodiment, generates a photovoltage 49 between first and second electrodes 45 and 46, which is the sum of the photovoltages generated by each of the individual photovoltaic units 41a, 41b, 41c and 41d. The present embodiment therefore allows for a high photovoltage generation.

Figure 5A:
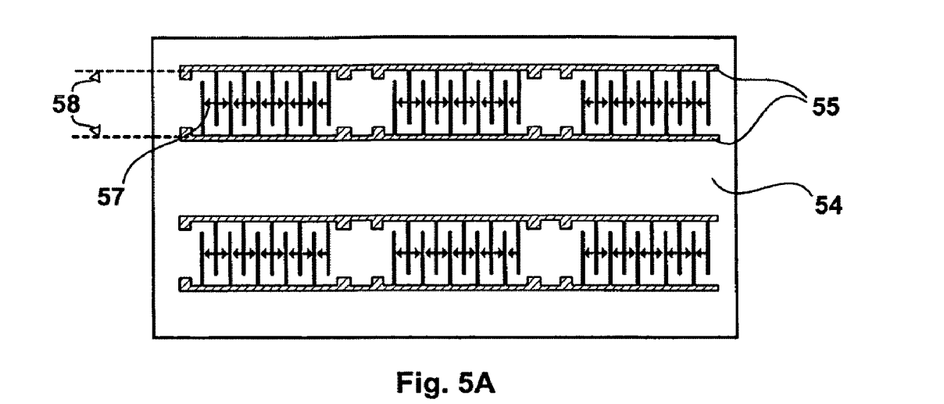
FIGS. 5A, 5B and 5C are top views of a photovoltaic device according to a further embodiment of the present invention.
Figure 5B:
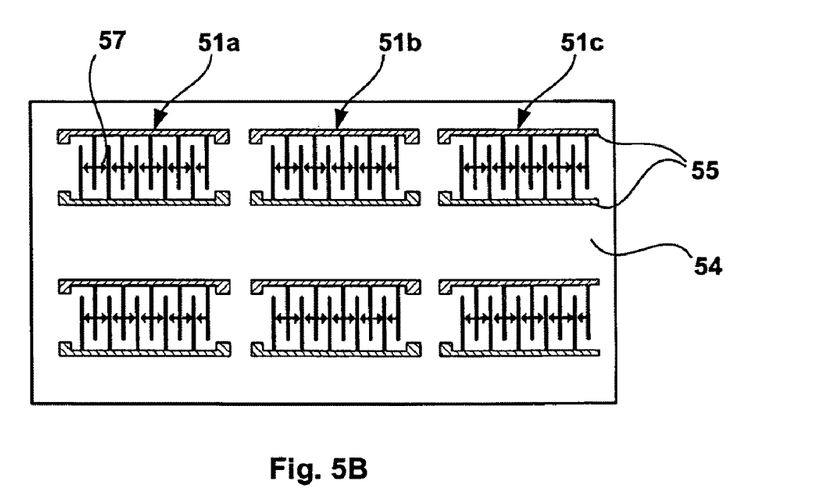
Figure 5C:
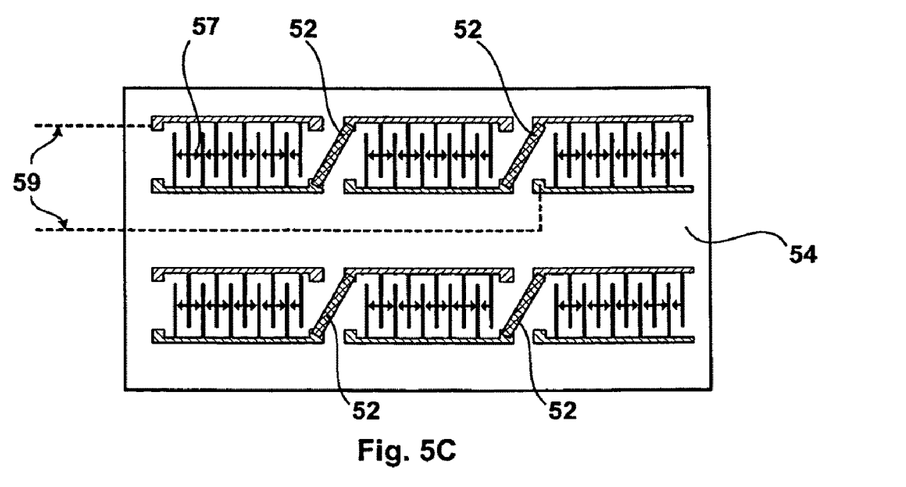

According to a further embodiment, as shown in FIGS. 5A, 5B and 5C, a photovoltaic device has one or more pairs of interdigital electrodes 55 formed on a ferroelectric layer 54. An electric field 58 is applied between the pair of electrodes 55, to polarize the ferroelectric thin film layer 54. Ferroelectric polarization 57 is formed in the ferroelectric layer 54 between adjacent fingers of the pair of electrodes 55, which are aligned along a direction parallel to the surface of the ferroelectric layer 54. Under a UV light exposure, the photovoltaic device comprising the multiple interdigital electrodes 55 connected in parallel as shown in FIG. 5A can generate an enhanced photocurrent.

After the ferroelectric thin film layer 54 is polarized, the pair of electrodes 55 is divided into two or more segments to form individual photovoltaic units 51 a, 51b and 51c. Subsequently, individual photovoltaic units 51a, 51b and 51c are reconnected by new circuit 52 in a manner similar to that shown in FIG. 4C. Individual photovoltaic units 51a, 51b and 51c are now connected in series. Upon exposure to a UV light, a photovoltaic device configured according to the present embodiment generates a photovoltage 59. The total photovoltage produced is the sum of the photovoltages generated by each individual photovoltaic unit 51a, 51b and 51c. Again, a high photovoltage can be obtained by the present embodiment. In addition, the total electric current generated by the device, is the sum of the individual electric current generated by each pair of adjacent fingers that are connected in parallel. A high photovoltage and an improved photovoltaic power can therefore be obtained by the present embodiment.

To illustrate a method of forming a thin film photovoltaic device according to embodiment of the present invention, the device shown in FIGS. 3A and 3B is used as an example. The method is described in detail below.

A surface-polished, 4-inch in diameter and (100)-orientated single-crystal silicon wafer is selected as the substrate 30. Substrate 30 is oxidized by being heated for 90 minutes at approximately 1000° C. This heating process forms the first intermediate layer, a 0.45 µm-thick silicon oxide 31. The second intermediate layer, a 0.21 µm-thick layer of $Si_3N_4$ 32, is deposited on silicon oxide layer 31, by a Low Pressure Chemical Vapor Deposition (LPCVD) process, at a temperature of approximately 700° C. for about 45 minutes. Subsequently, the third intermediate layer which is an yttria-stablized zirconia (YSZ) buffer layer 33 of 200 nm-thick, is formed on $Si_3N_4$ layer 32 by solution deposition. To prepare the YSZ thin film, Zr-propoxide is dissolved in acetic acid to obtain a 0.2 M solution. The zirconia is doped with yttrium oxide by adding 8 mol. % yttrium nitrate hexahydrate in the solution. The YSZ precursor solution is deposited on the $Si_3N_4$ layer 32 by multiple spin-coating process, followed by thermal annealing.

Ferroelectric thin film layer 34 is a Lanthanum- and tungsten-modified lead zirconate titanate composition, $Pb_{0.97}La_{0.03}(Zr_{0.52}Ti_{0.48})O_3$+x at. % $WO_3$ (x=0~1) (PL-WZT). Preferably, the value of x is selected between 0.2 and 0.5. Ferroelectric thin film layer 34 may be deposited by a chemical solution method. The precursor chemicals used to prepare the solution maybe lead acetate trihydrate, lanthanum acetate hexahydrate, tungsten ethoxide, zirconium acetylacetonate, and titanium isoproxide. To compensate for loss of lead during thermal annealing, an additional 10 mol. % lead is added to the precursor solution. 2-methoxyethanol (2-moe) is used as the solvent. Polyethylene glycol with molecular weight 400 (PEG-400) is used as an additive in order to eliminate cracking. For the preparation of the precursor solution, lead acetate and lanthanum acetate are first dissolved separately in 2-moe at 110° C. for 10 min and then cool down to 80° C. These two solutions are subsequently mixed in a vessel by stirring. During stirring, stoichiometric amount of zirconium acetylacetonate are added and mixed for 2 hr until the solution turns transparent and then cools down to room temperature. In a separate vessel, titanium isopropoxide is dissolved in 2-moe at 80° C. for 10 min followed by cooling down to room temperature. These above two solutions are mixed together and stirred for another 30 min. The solution is diluted to 0.4 M by adding additional 2-moe, followed by adding stoichiometric amount of tungsten ethoxide. PEG-400 was then added into the solutions by 30 wt % of the metal oxides. The resultant stock solutions are refluxed for 30 min at room temperature. All the manipulations are performed under dry nitrogen atmosphere inside a glove box.

The PLWZT solution is deposited onto the previously prepared YSZ/$Si_3N_4$/$SiO_2$/Si(100) wafer by a multiple, spin-coating process, at 5000 rpm for 20 seconds. Each layer is pyrolyzed at 430° C. for 2 minutes, followed by a heat treatment at 580° C. for 4 minutes after every three coating cycles. The final films after 9-coating cycle process are annealed at 750° C. for 10 minutes in air. The final ferroelectric thin film layer 34 has a thickness of about 0.5 µm.

Once the ferroelectric thin film layer 34 is formed, an Au layer is formed on the ferroelectric layer 34 by a lift-off process. This process leads to the formation of the electrode

35. During this process, a photoresist layer (not shown) is deposited through a spin-coating process, followed by a photolithography process, to form the negative pattern of the electrodes. Thereafter, an Au film of about 200 nm is deposited to cover the whole wafer area by a sputtering process. The patterned photoresist, together with the Au layer of the portions overlapping the remaining photoresist, are removed by acetone, leaving the electrode 35 of the desired interdigital pattern on top of ferroelectric PLWZT layer 34.

During the preparation of the Au layer, a Ti layer (not shown) of about 20 nm may be used to enhance the adhesion of Au electrode 35 on the ferroelectric PLWZT layer 34.

Figure 6:
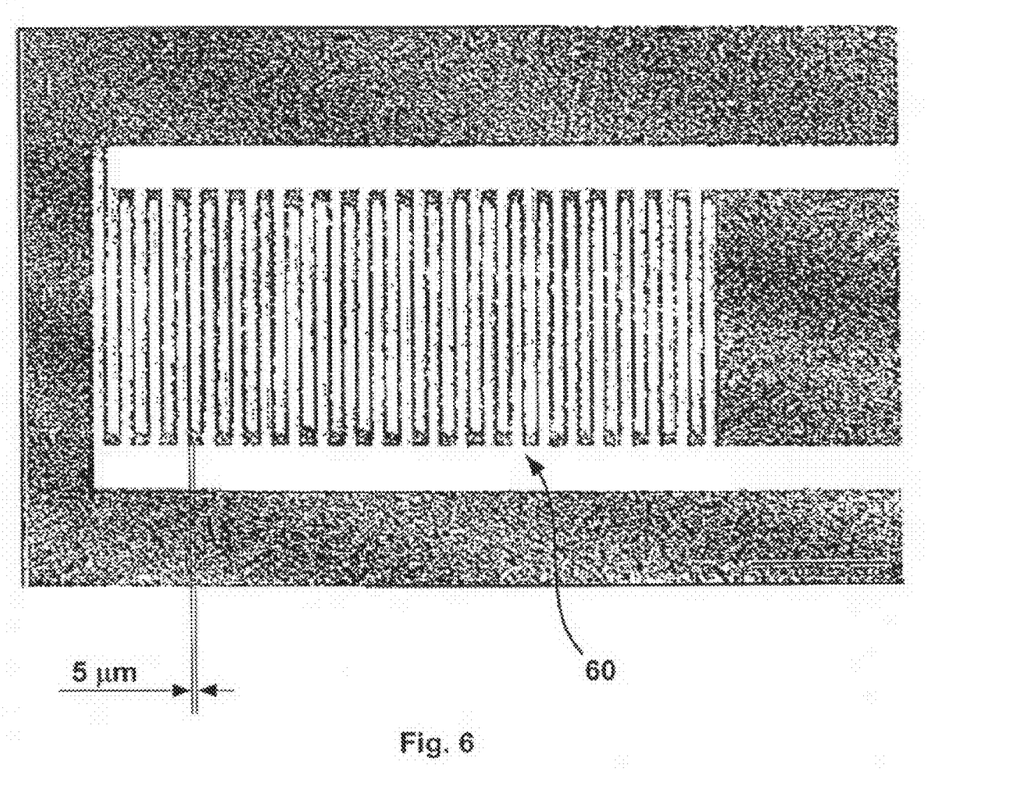
FIG. 6 is a microscopic photograph showing electrodes formed on a ferroelectric thin film of a photovoltaic device according to one embodiment of the present invention.

A microscopic photograph of an interdigital Au electrode 60 formed on a PLWZT/YSZ/$Si_3N_4$/$SiO_2$/Si(100) wafer according to the above method is shown in FIG. 6.

Upon completion of the electrode formation, electric field 38 of about 150 kV/cm is applied between electrode pads 35a and 35b to pole the ferroelectric thin film layer 34, resulting in a ferroelectric polarization 37 which is aligned in a direction parallel to the main surface plane 30a of substrate 30, and hence parallel to the ferroelectric thin film layer 34.

The performance and properties of the photovoltaic devices formed according to embodiment of the present invention are investigated under UV illumination using a mercury xenon lamp.

Figure 7A:
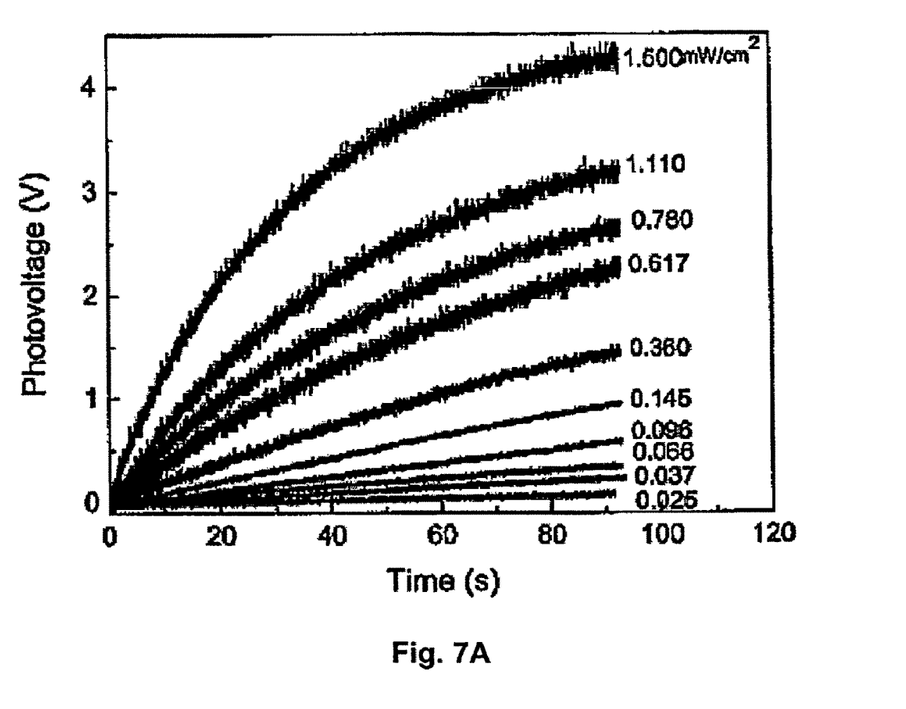
FIG. 7A is a graph showing the transient photovoltage response of a ferroelectric thin film photovoltaic device according to one embodiment of the present invention.
Figure 7B:
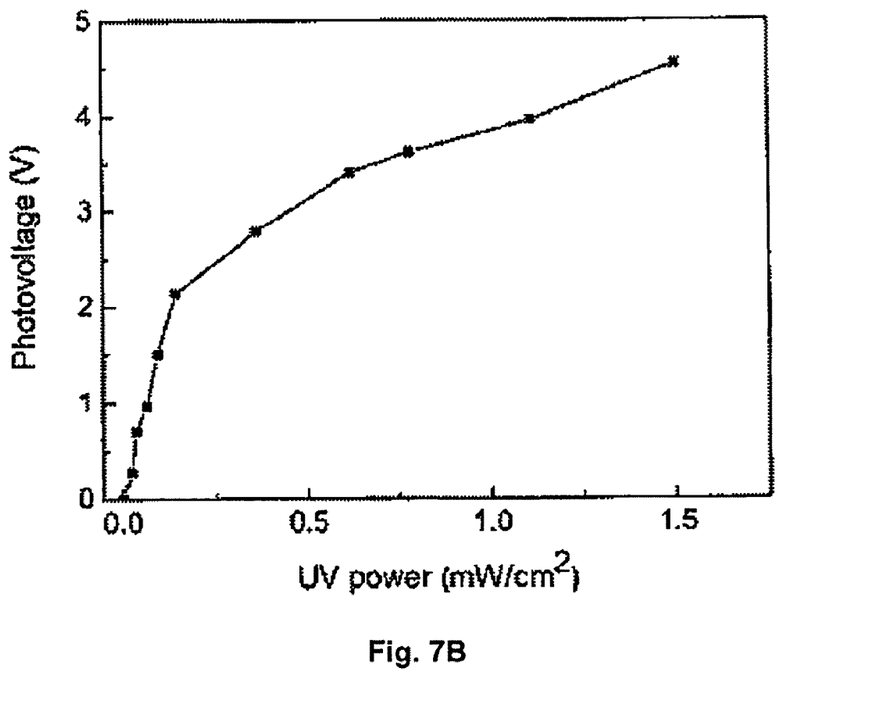
FIG. 7B is a graph showing the photovoltage magnitude of a ferroelectric thin film photovoltaic device as a function of UV power according to one embodiment of the present invention.

The light intensity dependence of photovoltage transient response of a photovoltaic device with a 10 μm electrode gap is shown in FIG. 7A, and the photovoltage values under 5 minutes of illumination is shown in FIG. 7B. As shown, the photovoltaic response is increased with the increase of the light intensity, and the photovoltage almost saturates in 90 second illumination at a light density above 1 $mW/cm^2$ FIG. 7B also indicates that the photovoltage increase rate is higher when the light intensity is lower. This is apparent when the light density is below 0.25 $mW/cm^2$. When the light intensity is above approximately 0.5 $mW/cm^2$, the photovoltage increase rate is reduced. A photovoltage magnitude of about 4.4 V is obtained under a light intensity of about 1.5 $mW/cm^2$.

Figure 8:
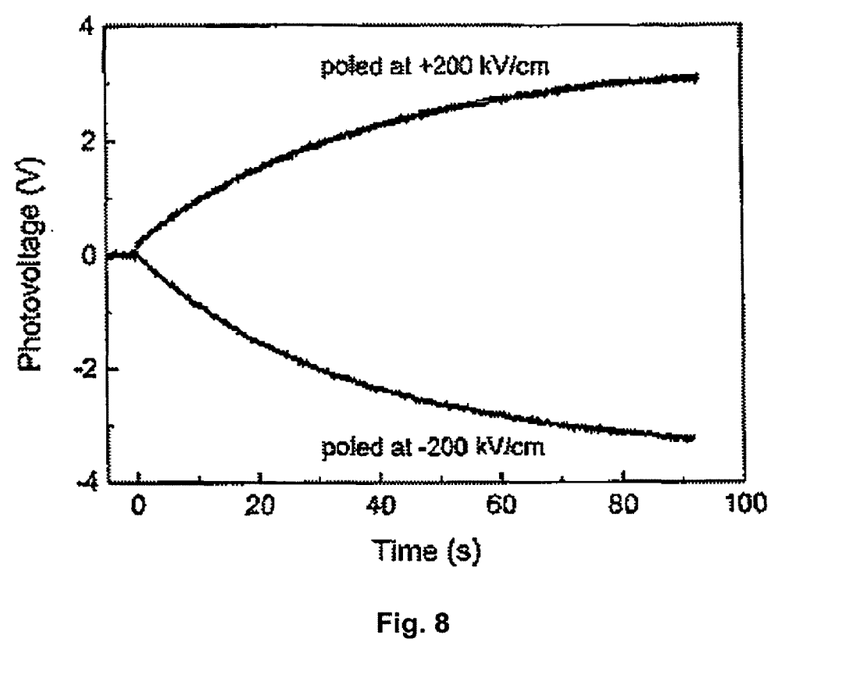
FIG. 8 is a graph showing the dependence of the photovoltage output polarity on the electric poling direction of a ferroelectric thin film photovoltaic device according to one embodiment of the present invention.
Figure 9:
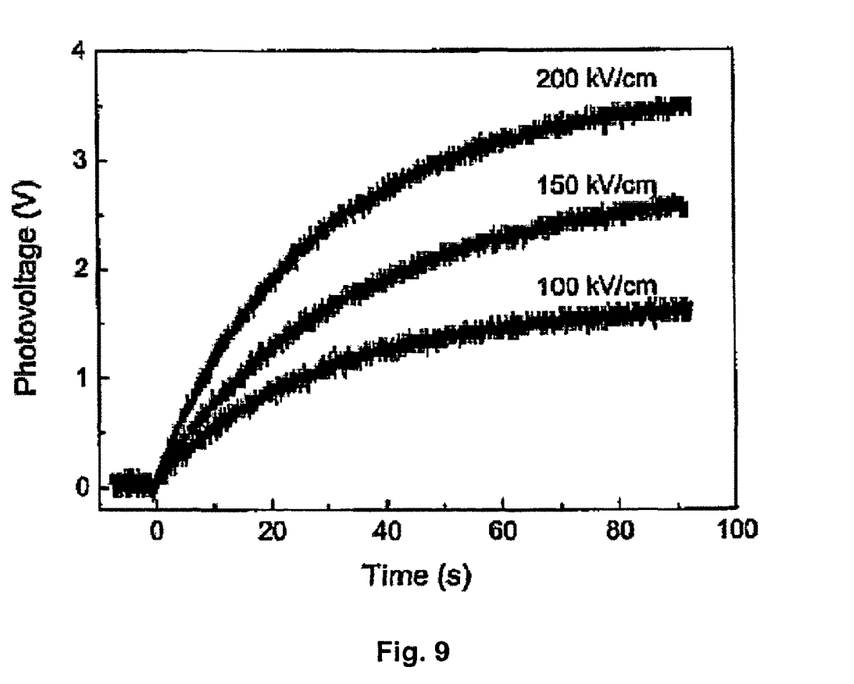
FIG. 9 is a graph showing the photovoltage response of a ferroelectric thin film photovoltaic device under different poling electric fields according to one embodiment of the present invention.

The polarity of the output photovoltage is determined by the direction of the ferroelectric polarization, and hence the electric field applied to pole the ferroelectric thin film layer. FIG. 8 presents the photovoltage transient responses corresponding to the two opposite polarities for the same test sample, when ferroelectric thin film layer is poled in opposite directions. Therefore, the polarity of the photovoltaic output may be changed based on the poling field. FIG. 9 shows that the photovoltage magnitude is higher if a higher electric field is applied to polarize the ferroelectric thin film layer.

Figure 10:
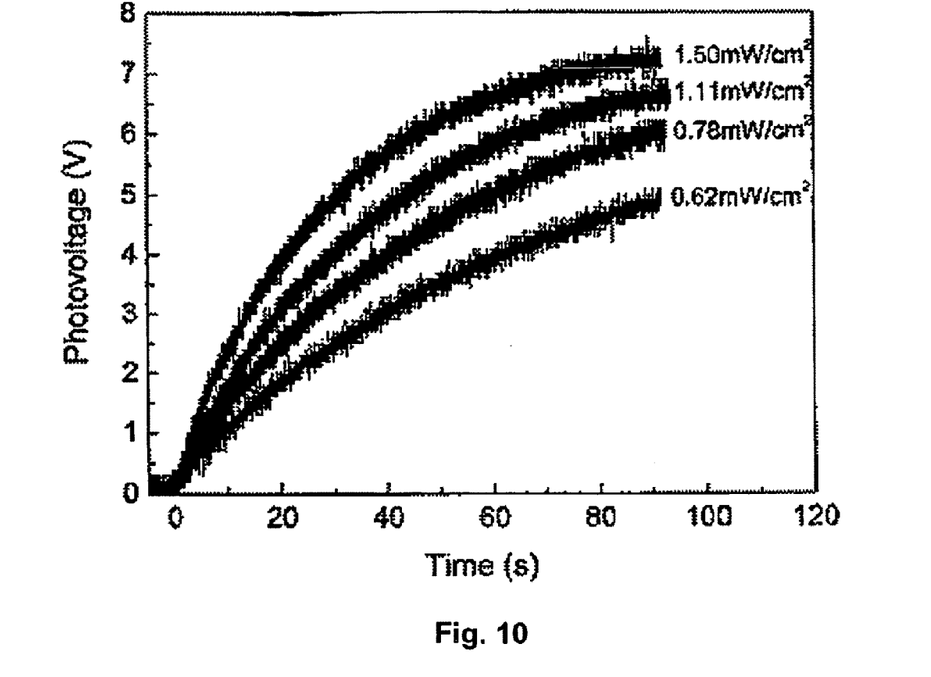
FIG. 10 is a graph showing the transient photovoltage response of a ferroelectric thin film photovoltaic device under different light intensity according to another embodiment of the present invention.
Figure 11:
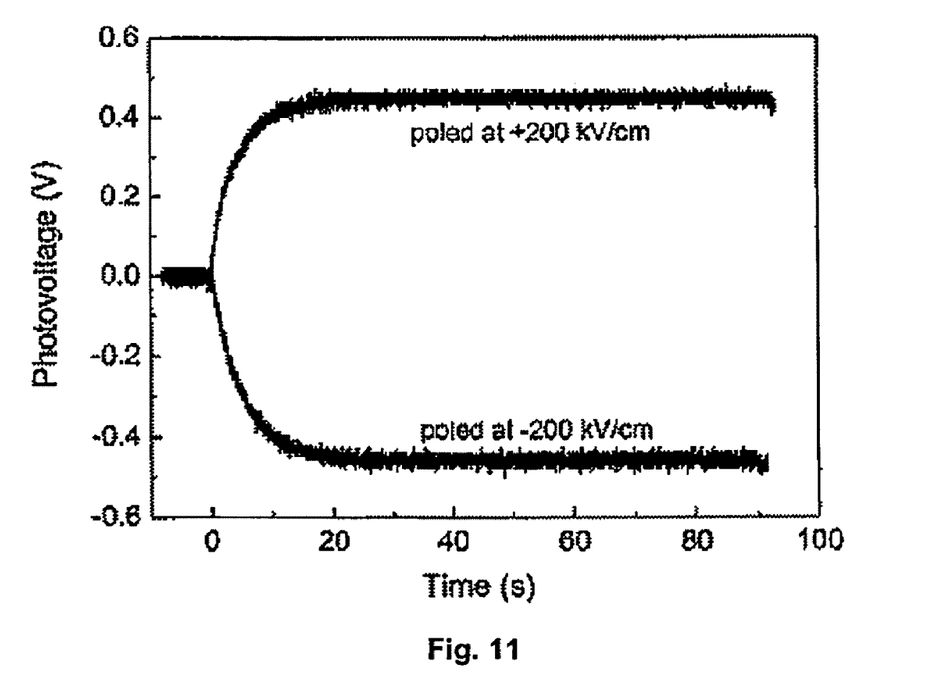
FIG. 11 is a graph showing the photovoltage response speed of a ferroelectric thin film photovoltaic device according to one embodiment of the present invention.

Another feature of the photovoltage device having an interdigital electrode with a larger electrode gap, is that it generates a higher photovoltage than what generated by conventional devices. FIG. 10 shows the improved photovoltage magnitude generated by a PLWZT thin film photovoltaic device with an electrode gap of about 25 μm, under different light intensities. The PLWZT thin film is polarized by an electric field of 150 kV/cm. A photovoltage of 7V is the result under a light intensity of 1.50 $mW/cm^2$. It is believed that the photovoltage can increase with a higher light intensity and/or a higher poling electric field In another test sample, in which the PLWZT thin film is approximately 0.72 μm thick, a shorter response time of about 10 seconds is demonstrated. FIG. 11 shows the photovoltage transient response with opposing polarities corresponding to the two different directions of the poling electric field. FIG. 11 also demonstrates that photovoltage devices exhibit symmetric performance in opposing photovoltage polarities when applying the present embodiment.

The thin film photovoltaic device shown in FIGS. 4A, 4B and 4C may be formed based on the same method detailed above. In particular, the preparation process of the $SiO_2$, $Si_3N_4$, YSZ and PLWZT layers are basically the same. To prepare the electrodes in a different configuration, a pair of Au electrodes 45 and 46 is formed by a sputtering, a lithography and a lift-off process.

When Au electrodes are formed as shown in FIG. 4A, an electric field of about 150 kV/cm is applied between the pair of electrodes 45 and 46 to polarize the ferroelectric thin film layer 44. The ferroelectric polarization 47 is aligned in a direction parallel to a main plane of the substrate, and hence parallel to the surface of the ferroelectric layer thin film 44. Thereafter, another photoresist layer is deposited by a spin-coating process, and a photolithography process is carried out followed by Au etching to form openings on the pair of electrodes 45 and 46, hence dividing the pair of electrodes 45 and 46 into segments 45a, 45b, 45c, 45d and 46a, 46b, 46c, 46d. Each pair of segments (45a and 46a, 45b and 46b, 45c and 46c, 45d and 46d) forms individual photovoltaic units 41a, 41b, 41c and 41d, having the ferroelectric polarization aligned along the same direction, as shown in FIG. 4B.

After removing the photoresist forming the openings between the pairs of electrodes, a further photoresist layer is deposited onto the divided electrodes by a spin-coating process, followed by a third photolithography process to form the negative pattern of connection circuits 42. A further Au film is deposited subsequently. The prior patterned photoresist, together with the Au layer covering the photoresist are removed, thereby forming connection circuit 42 which connects segments 45a, 45b, 45c, 45d and 46a, 46b, 46c, 46d in serial, as shown in FIG. 4C.

It should be appreciated that photovoltaic devices shown in FIG. 5C may also be prepared in process similar to that illustrated above.

Figure 12:
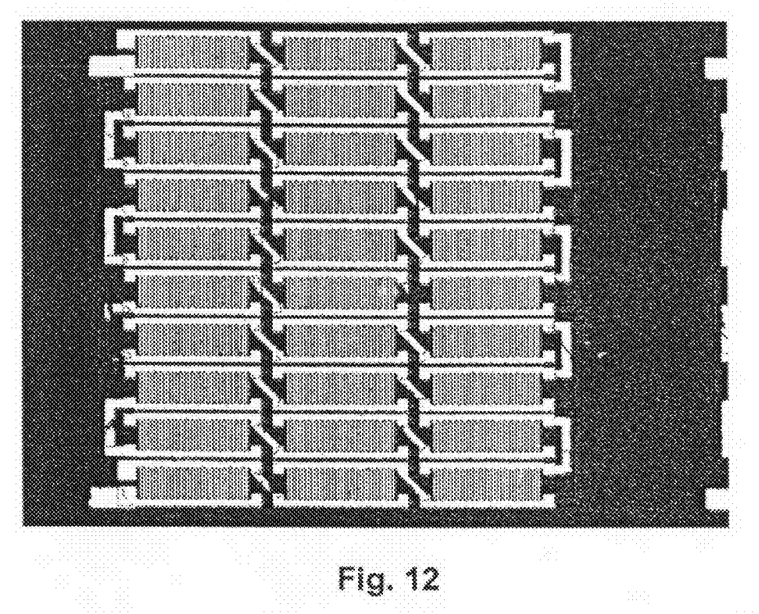
FIG. 12 is a microscopic photograph showing electrodes formed on a ferroelectric thin film of a photovoltaic device according to one embodiment of the present invention.
Figure 13:
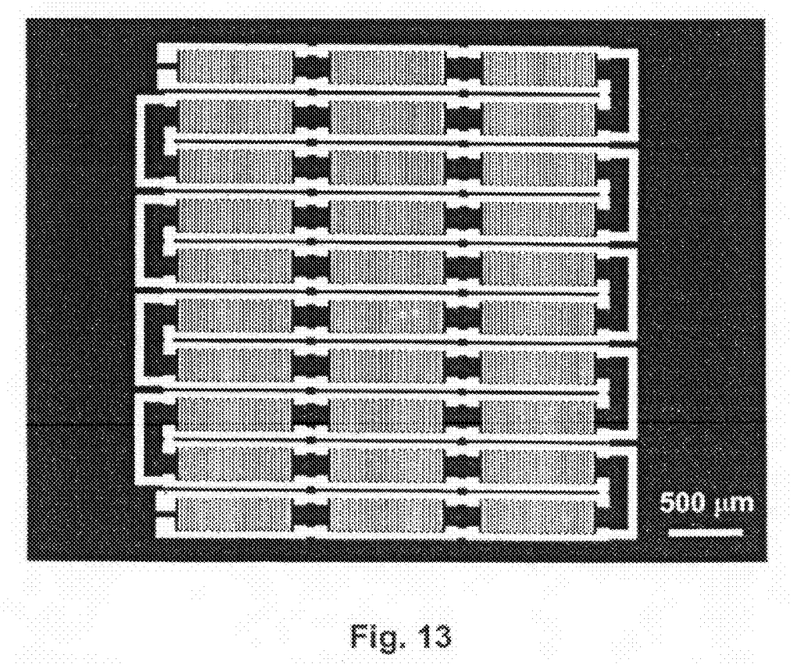
FIG. 13 is a microscopic photograph showing electrodes formed on a ferroelectric thin film of a photovoltaic device according to another embodiment of the present invention.

FIG. 12 shows an electrode pattern of a PLWZT photovoltaic device fabricated according to an embodiment of the present invention. In this embodiment, the top electrodes comprise 30 pairs of interdigital electrodes that are connected in series, as illustrated in FIG. 5C. The electrode gap in each of the interdigital electrodes is 10 μm wide. FIG. 13 shows another fabricated electrode pattern of a photovoltaic device according to a further embodiment. The electrode pattern in FIG. 13 comprises 30 pairs of interdigital electrodes that are connected in parallel to generate a large photocurrent, as illustrated in FIG. 5A.

Figure 14:
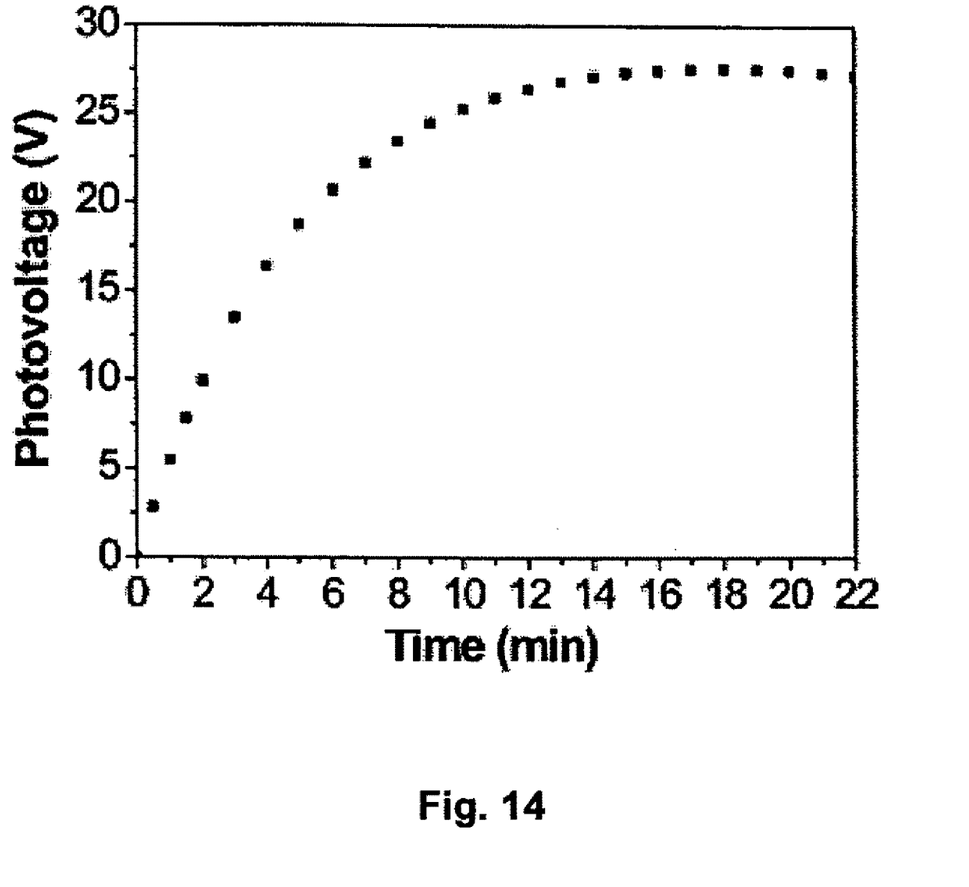
FIG. 14 is a graph showing the photovoltage response of a ferroelectric thin film photovoltaic device having electrodes formed as shown in FIG. 12.

FIG. 14 presents the measured photovoltage of the photovoltaic device shown in FIG. 12, in which a photovoltage of 27 V is obtained. With another photovoltaic device comprising 18 pairs of interdigital electrodes connected in series and with an increased electrode gap of 25 μm, a photovoltage as large as 46.5 V is demonstrated.

Although embodiments of the present invention have been illustrated in conjunction with the accompanying drawings and described in the foregoing detailed description, it should be appreciated that the invention is not limited to the embodiments disclosed, and is capable of numerous rearrangements, modifications, alternatives and substitutions without departing from the spirit of the invention as set forth and recited by the following claims.

The invention claimed is:

1. A method of forming a thin film photovoltaic device, comprising:
   forming a ferroelectric thin film layer on a substrate, wherein the ferroelectric thin film layer is to convert light into electricity to generate photovoltaic outputs;
   forming first and second electrodes on one side of the ferroelectric thin film layer; and
   polarizing the ferroelectric thin film layer in a direction about parallel to a surface plane of the ferroelectric thin film layer by applying a voltage across the first and second electrodes;
   wherein the first and second electrodes are to collect the photovoltaic outputs.

2. The method as recited in claim 1, further comprising:
   dividing each of the first electrode and the second electrode into at least two segments;
   connecting one segment of the first electrode with one segment of the second electrode.

3. The method as recited in claim 2, wherein the first electrode and the second electrode are divided after the ferroelectric thin film layer is polarized.

4. The method as recited in claim 3, wherein the electric polarizations in the ferroelectric thin film layer are connected in series by connecting the electrode segments.

5. The method as recited in claim 1, wherein the ferroelectric thin film layer has a first side for receiving light and a second side to contact the substrate, wherein the first and second electrodes are formed on the first side.

6. The method as recited in claim 1, wherein the first and second electrodes are interdigitally disposed with respect to each other.

7. The method as recited in claim 1, further comprising, after polarizing the ferroelectric thin film layer by an electric field applied through the first and second electrodes, varying electrical connection for collecting the photovoltaic outputs.

8. The method as recited in claim 7, wherein the electric polarizations in the ferroelectric thin film layer are connected in series by dividing the first and second electrodes into separate segments and subsequently connecting the segments of the first electrode with the segments of the second electrodes after the electric poling.

9. The method as recited in claim 8, wherein the first and second electrodes are divided into separate segments by an etching process.

10. The method as recited in claim 8, wherein the electrode segments are connected by a photolithography process followed by a thin film deposition process and a lift-off process.

* * * * *